United States Patent
Kodama

(10) Patent No.: US 6,205,568 B1
(45) Date of Patent: Mar. 20, 2001

(54) DATA TRANSMISSION SYSTEM AND ERROR CORRECTING METHOD APPLICABLE TO THE SAME

(75) Inventor: Kunihiko Kodama, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/022,400

(22) Filed: Feb. 12, 1998

(30) Foreign Application Priority Data

Feb. 15, 1997 (JP) .................................................. 9-047063

(51) Int. Cl.[7] .................................................. H03M 13/29
(52) U.S. Cl. .................................................. 714/755
(58) Field of Search .................................. 714/755, 756, 714/758, 761, 762, 765, 769

(56) References Cited

U.S. PATENT DOCUMENTS

| | | | |
|---|---|---|---|
| 4,476,562 | * | 10/1984 | Sako et al. ................................ 371/39 |
| 4,680,764 | * | 7/1987 | Suzuki et al. ............................ 371/40 |
| 4,785,451 | * | 11/1988 | Sako et al. ............................... 371/37 |
| 5,392,299 | * | 2/1995 | Rhines et al. ........................ 371/37.5 |
| 5,463,640 | * | 10/1995 | Cloetens ............................... 371/37.1 |
| 5,974,580 | * | 10/1999 | Zook et al. ............................ 714/755 |

* cited by examiner

Primary Examiner—Stephen M. Baker
(74) Attorney, Agent, or Firm—Oblon, Spivak, McClelland, Maier & Neustadt, P.C.

(57) ABSTRACT

A data transmission system comprising a receiving device for receiving data to which a pair of error correction codes consisting of product codes is added, one error correction code having a data arrangement identical with the order in which the receiving device receives the data, a temporary storage device for storing the data temporarily, an error sensing device for sensing errors in one error correction code, before storing the data in the temporary storage device, an error correcting device for correcting errors in the data stored in the temporary storage device, the error correcting device executing erasure correction of the other error correction code by using information on errors in one error correction code sensed at the error sensing device, and a transmitting device for transmitting the data whose errors have been corrected by the error correcting device.

16 Claims, 4 Drawing Sheets

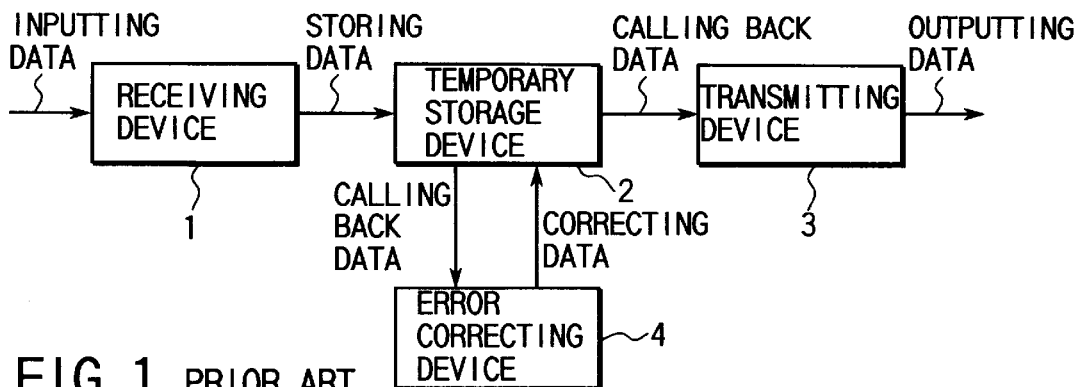
FIG. 1 PRIOR ART
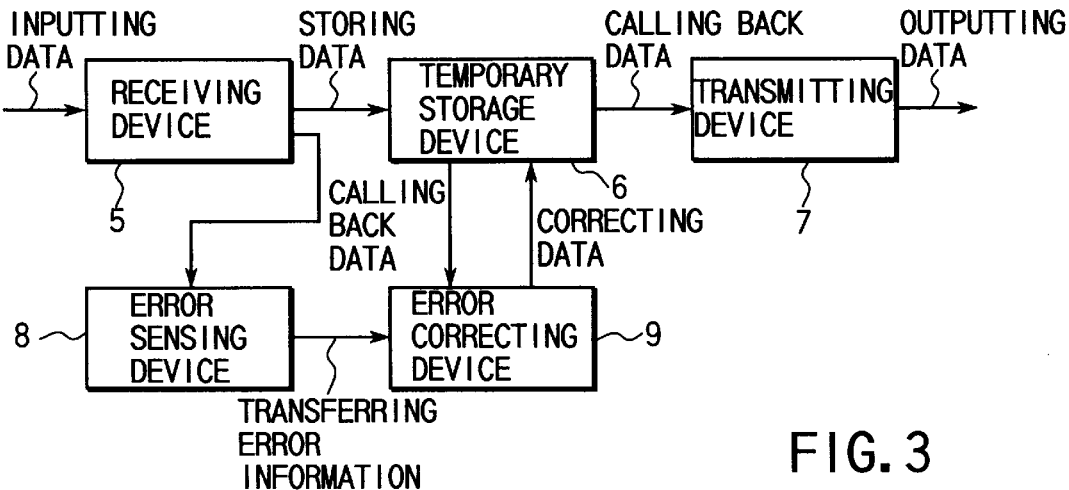
FIG. 2
FIG. 3

DATA TRANSMISSION SYSTEM AND ERROR CORRECTING METHOD APPLICABLE TO THE SAME

BACKGROUND OF THE INVENTION

This invention relates to a data transmission system using a device for correcting errors in the received data and an error correcting method.

A conventional data transmission system, such as a disk reproducing device, comprises a receiving device 1 for receiving data, a temporary storage device 2 for storing the received data temporarily, an error correcting device 4 for correcting errors in the data temporarily stored, and a transmitting device 3 for transmitting the error-corrected data, as shown in FIG. 1.

As an example of data, consider the data received in this order: $[d_{0,0}, d_{0,1}, d_{0,2}, \ldots, d_{0,M-1}, d_{1,0}, d_{1,1}, \ldots, d_{N-1,M-2}, d_{N-1,M-1}]$ as shown in FIG. 2, and assume that error correction codes P (internal code) and Q (external code) consisting of product codes as shown in FIG. 2 are added to the data. In this case, information on the sensing of errors in the data codes using one correction code P, or the internal code, can be used for what is called an erasure correction using the other correction code Q, or the external code.

In the conventional system, the data recorded on a disk or the like is received by the receiving device 1. The received data is stored in the temporary storage device 2. An error correcting process using the error correction codes P and Q consisting of the product codes is performed on the data stored in the temporary storage device 2.

Specifically, the data stored in the temporary storage device 2 is called back to the error correcting device 4. The error correcting device 4 then executes a correcting process using the internal code P first. Because in the first correcting process, there is no error position information, erasure correction cannot be performed. In that case, the correcting process is performed on the data using only the internal code P and the result is stored in the temporary storage device 2.

Then, the data is called back again from the temporary storage device 2 to the error correcting device 4, which then performs a correcting process using the external code Q. In this correcting process, it is possible to perform erasure correction on the basis of information on the position of the error sensed in the correcting process of the internal code P, in addition to the correcting process using only the external code Q.

That is, with the conventional error correcting device, erasure correction cannot be performed in the first correcting process. After the first correcting process using the internal code P, however, when the correcting process using the external code Q is performed on the basis of information on the first correction, this achieves a sufficient correcting capability, even if erasure correction is not carried out in the first correcting process.

To do this, it is necessary to repeat the correcting process using the internal code P and the correcting process using the external code Q. Therefore, to perform error corrections at high speed, the data transfer rate between the error correcting device 4 and the temporary storage device 2 has to be increased.

An attempt to increase the data transfer rate between the error correcting device 4 and the temporary storage device 2 gives rise to an increase in the device size and in the power consumption resulting from the faster operation.

BRIEF SUMMARY OF THE INVENTION

The main object of the present invention is to provide a data transmission system capable of avoiding the problems of an increase in the power consumption and in the device size resulting from the faster operation needed for the repetition of error correcting processes using internal and external codes, by providing a data transfer device capable of performing erasure correction in a correcting process first carried out.

According to a first aspect of the present invention, there is provided a data transmission system comprising: a receiving device for receiving data to which a pair of error correction codes consisting of product codes is added, one error correction code having a data arrangement identical with the order in which the receiving device receives the data; a temporary storage device for storing the data temporarily; an error sensing device for sensing errors in one error correction code, before storing the data in the temporary storage device; an error correcting device for correcting errors in the data stored in the temporary storage device, the error correcting device executing erasure correction of the other error correction code by using information on errors in one error correction code sensed at the error sensing device; and a transmitting device for transmitting the data whose errors have been corrected by the error correcting device.

With this configuration, erasure correction can be performed in a correcting process first carried out at the error correcting device.

It is desirable that the error sensing device should be a syndrome computing device that calculates a syndrome for one of the pair of error correction codes consisting of product codes. It is also desirable that the error correcting device should perform erasure correction using a specific number of syndromes instead of using all of the syndromes for one error correction code. This could speed up the sensing process and the correcting process.

The application of the data transmission system to a DVD reproducing device or a CD-ROM device enables the system to exhibit its capability effectively.

According to a second aspect of the present invention, there is provided an error correcting method comprising: a first step of sensing errors in one error correction code received in the order in which data has been received of a pair of error correction codes consisting of product codes added to the data and then storing the data in a temporary storage device; a second step of calling back the other error correction code of the product codes added to the data from the temporary storage device and performing not only an error correcting process using only the other error correction code but also erasure correction on the basis of information on the errors in one error correction code sensed in the first step; and a third step of correcting the data stored in the temporary storage device.

It is desirable that the error correcting method should further comprise: a fourth step of calling back the one error correction code for the data from the temporary storage device; a fifth step of performing not only an error correcting process using only the one error correction code but also erasure correction using information on errors in the other error correction code; a sixth step of correcting the data stored in the temporary storage device; a seventh step of calling back the other error correction code from the temporary storage device; an eighth step of performing not only an error correcting process using only the other error correction code but also erasure correction on the basis of information on the errors in the one error correction code; and a ninth step of correcting the data in the temporary storage device.

Furthermore, it is desirable that the fourth step to the ninth step should be repeated according to the error correcting capability needed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram of a conventional data transmission system;

FIG. 2 shows the structure of data including product codes;

FIG. 3 is a block diagram of a data transmission system according to a first embodiment of the present invention;

DETAILED DESCRIPTION OF THE INVENTION

Hereinafter, referring to the accompanying drawings, embodiments of the present invention will be explained.

(First Embodiment)

Figure 4:
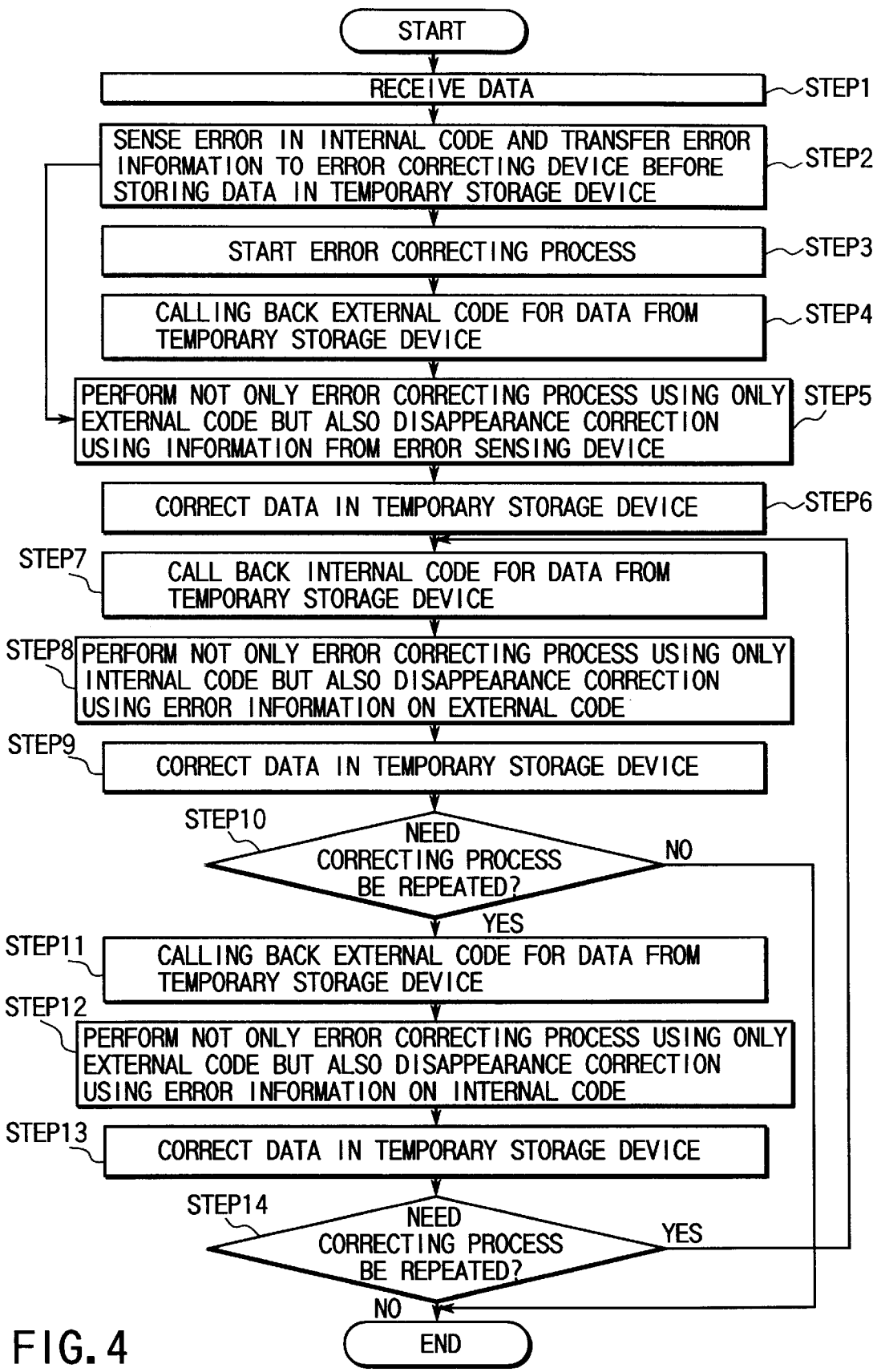
FIG. 4 is a flowchart for the operation of the data transmission system of the first embodiment.

A data transmission system according to a first embodiment of the present invention will be explained by reference to FIGS. 3 and 4.

FIG. 3 is a block diagram of a data transmission system of the first embodiment. The data transmission system comprises a receiving device 5 for receiving data, a temporary storage device 6 for storing the received data temporarily, an error correcting device 9 for correcting errors in the data temporarily stored, and a transmitting device 7 for transmitting the error-corrected data.

In the data transmission system, the data recorded on a disk or the like is received by the receiving device 5. The received data is stored in the temporary storage device 6. Thereafter, the data stored in the temporary storage device 6 is called back to the error correcting device 9, which then corrects errors.

The data transmission system further comprises an error sensing device 8 that receives the data shown in FIG. 2 from the receiving device 5 and senses errors in the data using at least one of an internal code P and an external code Q, both being product codes. The error sensing device 8 is designed to transfer to the error correcting device 9 the error information sensed using one error correction code, that is, error correction information and error position information.

This enables the error correcting device 9 to correct the data called back from the temporary storage device 6 on the basis of information on the error sensed using one error correction code transferred from the error sensing device 8 and the other error correction code called back from the temporary storage device 6.

With this configuration, because it is possible to get error information at the error sensing device 8 beforehand, the error correcting device 9 can perform erasure correction in a correcting process first carried out.

The procedure for the process of correcting errors in the first embodiment will be described in further detail by reference to a flowchart in FIG. 4.

(First Correcting Process)

First, the data is received by the receiving device 5 (step 1). Then, the error sensing device 8 senses an error in the internal code P (see FIG. 2) and transfers information on the sensed error to the error correcting device 9 (step 2). Thereafter, the receiving device 5 transfers the data in the temporary storage device 6.

Then, the data stored in the temporary storage device 6 start to be corrected (step 3).

The external code Q for the data is called back from the temporary storage device 6 to the error correcting device 9 (step 4). Next, the error correcting device 9 performs not only an error correcting process using only the external code Q but also erasure correction on the basis of information on the errors in the internal code P sensed in step 2 (step 5). Then, by these correcting processes, the data stored in the temporary storage device 6 is corrected (step 6). This enables erasure correction to be performed on the basis of the internal code P and external code Q in the first error correcting process carried out at the error correcting device.

(Correcting Process Using Internal Code)

Next, the internal code P for the data is called back from the temporary storage device 6 to the error correcting device 9 (step 7). The error correcting device 9 performs not only the error correcting process using only the internal code P but also erasure correction on the basis of information on the error in the external code Q sensed in step 5 (step 8). Then, by these correcting processes, the data stored in the temporary storage device 6 is corrected (step 9).

At step 10, it is judged whether or not the correcting process should be repeated. If it need not be repeated, the error correcting process will be terminated (END). If it is needed, the correcting process using the external code Q will be further performed.

(Correcting Process Using External Code)

First, the external code Q for the data is called back from the temporary storage device 6 to the error correcting device 9 (step 11). The error correcting device 9 performs not only the error correcting process using only the external code Q but also erasure correction on the basis of information on the error in the internal code P sensed in step 8 (step 12). Then, by these correcting processes, the data stored in the temporary storage device 6 is corrected (step 13).

At step 14, it is judged whether or not the correcting process should be repeated. If it need not be repeated, the error correcting process will be terminated (END). If it is needed, step 7 to step 13 will be repeated.

With this configuration, before the data stored in the temporary storage device 6 is corrected, the error sensing device 8 senses errors in the internal code P, one of the error correction codes. Because information on the sensed error includes information on the position of the error, the error correcting device 9 can perform erasure correction in a correcting process first carried out.

While in the first embodiment, errors in the internal code P are sensed and then errors in the external code Q are corrected, errors in the external code Q may be first sensed and then the internal code be corrected.

(Second Embodiment)

As a second embodiment of the present invention, an example of applying the invention to a DVD (Digital Versatile Disc) reproducing device will be explained.

Figure 5:
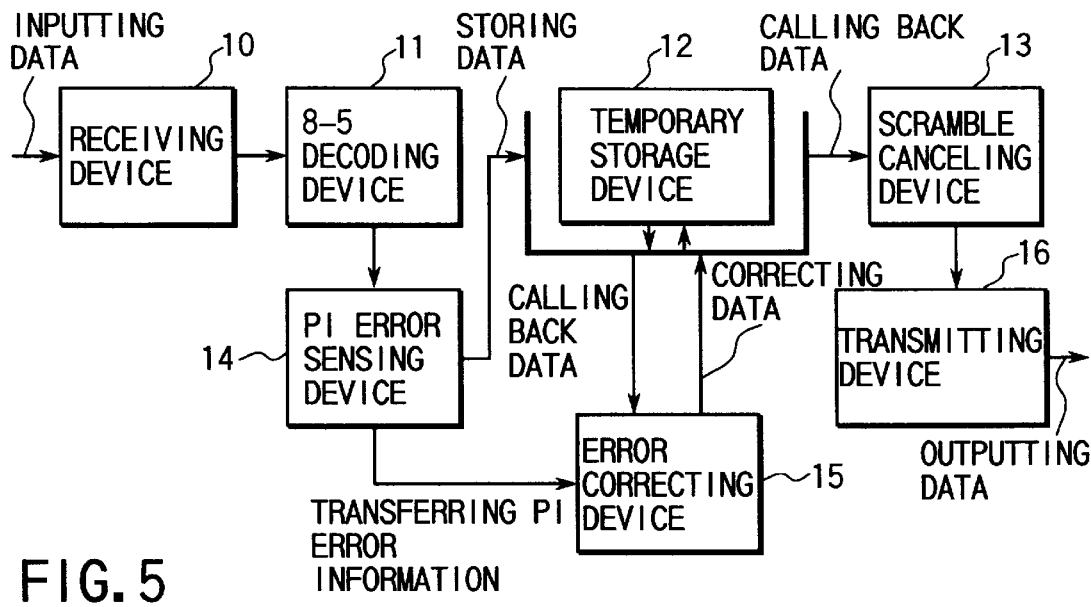
FIG. 5 is a block diagram of a DVD reproducing device according to a second embodiment of the present invention.
Figure 8:
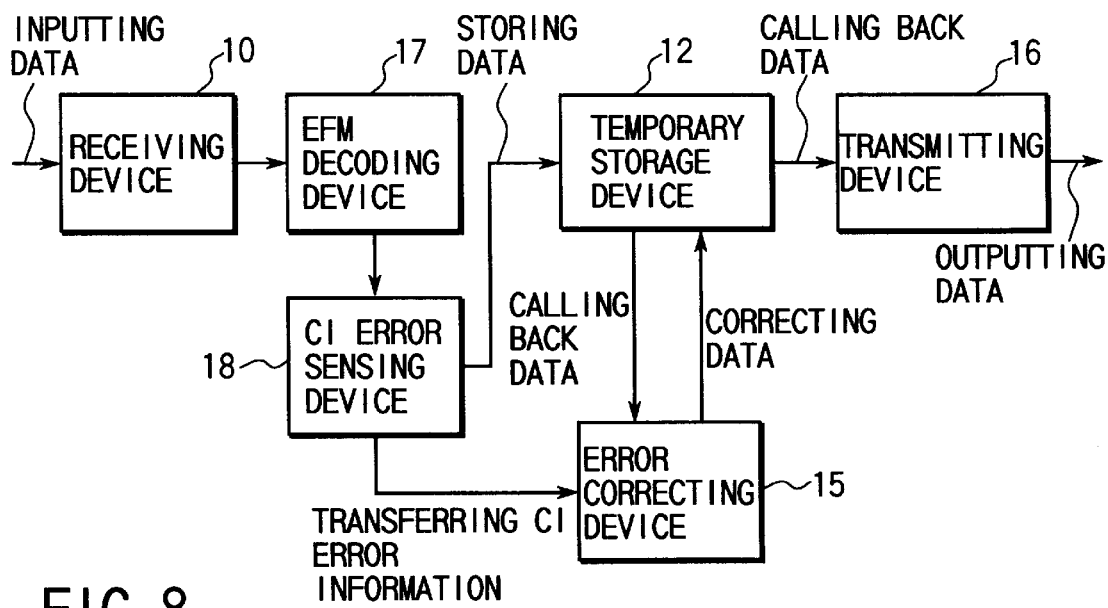
FIG. 8 is a block diagram of a CD-ROM drive according to a fourth embodiment of the present invention.

FIG. 5 is a block diagram of a DVD reproducing device of the second embodiment. The DVD reproducing device comprises a receiving device 10 for receiving data, a 8–16 decoding device 11 for modulating the received data by an 8-bit-to-16-bit modulation method, a PI error sensing device 14 for sensing errors in the data using an internal code PI of product code, an temporary storage device 12 for receiving the data from the PI error sensing device 14 and storing it temporarily, an error correcting device 15 for correcting errors in the data stored in the temporary storage device 12 on the basis of error information transferred from the PI error sensing device 14, a scramble cancel device 13 for calling back the data from the temporary storage device 12, and a transmitting device 16 for transmitting the data which has been called back to the scramble cancel device 13 and whose errors have been corrected.

In the DVD reproducing device, the PI error sensing device 14 senses errors in the data. Then, the data stored in the temporary storage device 12 is called back to the error correcting device 15. The error correcting device 15 corrects the data on the basis of the error information transferred from the PI error sensing device 14 and stores the corrected data in the temporary storage device 12. The data in the temporary storage device 12 is called back to the transmitting device 16 via the scramble cancel device 13. The transmitting device 16 outputs the data to the outside world.

With the DVD device of the second embodiment, too, because it is possible to get error information at the PI error sensing device 14 beforehand, erasure correction can be performed in a correcting process first carried out at the error correcting device 15 as in the first embodiment.

Hereinafter, the operation of the DVD reproducing device will be explained in detail.

First, the data received by the receiving device 10 is demodulated at the 8–16 decoding device 11. Before the data is stored in the temporary storage device 12, the PI error sensing device 14 calculates syndromes for the internal code PI and senses the presence or absence of errors in the data. In the DVD reproducing device, the internal code PI has 10 parities and the external code PO has 16 parities. The PI error sensing device 14 senses the presence or absence of errors in the data, depending on whether all of the syndromes for the internal code, that is, all of the ten syndromes (S0 to S9) are zero.

In the DVD reproducing device, the arrangement of the internal code PI coincides with the arrangement of the received data, which enables the demodulated data to be subjected to syndrome calculation.

The error information sensed in this way is transferred to the error correcting device 15.

The error correcting device 15 starts an error correcting process using the external code PO. At this time, the error correcting device 15 performs not only the error correcting process using only the external PO but also a erasure correcting process on the basis of information on errors in the internal code PI acquired in the preceding step. That is, the error correction is carried out in this order: PI error sensing, PO, PI, PO, PI, . . .

While in the second embodiment, all of the syndromes of the internal code PI are used as means for sensing errors, all of the syndromes are not necessarily used, if the reliability of sensing errors may be sacrificed.

Specifically, in the PI error sensing device 34, a specific number of syndromes (S0 to S9) for the internal code PI, not all, may be calculated and the presence or absence of errors in the data be sensed, depending on whether they are zero or not. In this case, since the number of times that errors in the syndromes are sensed is smaller than when errors in all of the syndromes are sensed, it is possible to speed up the sensing process or decrease the size of the circuit.

(Third Embodiment)

Hereinafter, a third embodiment of the present invention will be explained.

Figure 6:
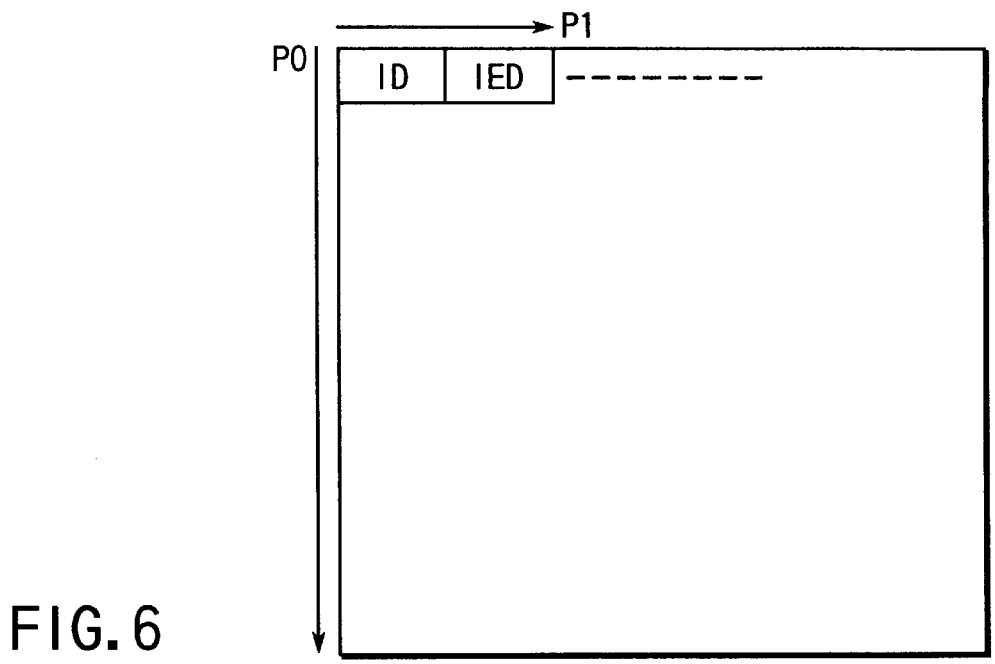
FIG. 6 shows the arrangement of product codes including errors.

In a DVD reproducing device according to the third embodiment, the arrangement of error correction codes IED added to ID data coincides with the arrangement of internal codes. FIG. 6 shows the arrangement (a correction block) of product codes including errors. An error correction code IED is arranged in ID data. Internal codes PI are arranged horizontally and external codes PO are arranged vertically.

The data received by the receiving device is demodulated at the 8–16 decoding device. Before the data is stored in the temporary storage device, syndromes for the internal code PI are calculated. The presence or absence of errors in the data is sensed, depending on whether the syndrome is zero or not. Information on the sensed error is transferred to the error correcting device.

The PI error sensing device of the third embodiment is characterized by calculating S0 and S1 of the syndromes for the internal code PI with an IED parity computing device, where $S0=\Sigma di$ (i=0 to 181) and $S1=\Sigma \alpha^i di$ (i=0 to 181).

Figure 7A:
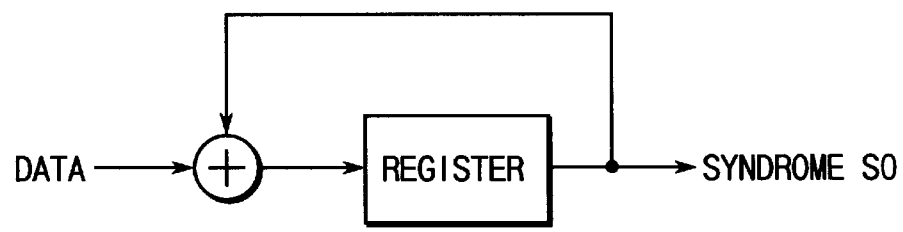
FIGS. 7A and 7B are circuit diagrams of syndrome computing devices used for an error sensing device.
Figure 7B:
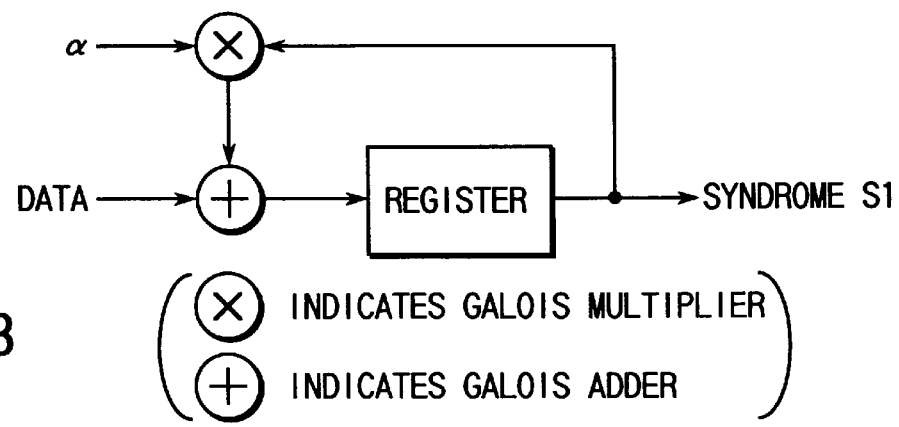

FIG. 7A shows a computing device for syndrome S0 and FIG. 7B shows a computing device for syndrome S1.

While in the second and third embodiments, the result of computing the syndromes for the internal code is used as means for sensing errors in the data before the data is stored in the temporary storage device, the result of making calculations to correct errors in the internal code may be used as error sensing means.

(Fourth Embodiment)

As a fourth embodiment of the present invention, an example of applying a data transmission system of the invention to a CD-ROM drive will be explained.

The CD-ROM drive comprises a receiving device 10 for receiving data, an EFM decoding device 17 for demodulating the received data, a C1 error sensing device 18 for sensing errors in the data using C1 code of the product codes C1 and C2, a temporary storage device 12 for storing the received data temporarily, an error correcting device 15 for correcting errors in the data on the basis of error information transferred from the C1 error sensing device, and a transmitting device 16 for calling back the data subjected to error correction from the temporary storage device 12 and transmitting it.

The CD-ROM drive performs a similar correcting process to that in the DVD reproducing device. Namely, the C1 error sensing device 18 senses error in C1 code before the error correcting device 15 performs the error correcting process.

The error correcting device 15 starts with an error correcting process using C2 code. At that time, the error correcting device 15 performs not only the error correcting process using only C2 code but also erasure correction on the basis of information on errors in C1 code received from the C1 error sensing device 18. That is, error correction is carried out in this order: C1 error sensing, C2, C1, C2, C1, . . . .

Therefore, with the CD-ROM driver, too, erasure correction can be performed in a correcting process first carried out, as in the first to third embodiment.

As described above, with the present invention, because the first sensing of errors in the data can be done before the data is stored in the temporary storage device, it is possible to achieve a sufficient error correcting capability without speeding up the data transfer rate between the error correcting device and the temporary storage device.

Furthermore, the present invention can be realized easily by just adding such a small-scale device as a syndrome computing device to a conventional error correcting device.

Moreover, because erasure correction can be performed in the first correcting process, if the number of times the correcting processes of the internal code and external codes are repeated in the invention is equal to that in a conventional correcting device, erasure correction can be performed once more than in the conventional correcting device.

The present invention is not limited to the first to fourth embodiments and may be practiced or embodied in still other ways without departing from the spirit or essential character thereof.

For instance, a data transmission system including an error correcting device of the invention is applicable to a communication system, a computer system, an information system, a video game system, and other various data transmission systems.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data transmission system comprising:
   a receiving device for receiving data to which a pair of error correction codes is added, one error correction code having a data arrangement identical with the order in which the receiving device receives the data;
   a temporary storage device for storing said data temporarily;
   an error sensing device for sensing errors in one error correction code, before storing said data in the temporary storage device, said error sensing device including a syndrome computing device which calculates a syndrome for one of said pair of error correction codes consisting of product codes;
   an error correcting device for correcting errors in said data stored in said temporary storage device, said error correcting device executing erasure correction of the other error correction code by using information on errors in the one error correction code sensed at said error sensing device; and
   a transmitting device for transmitting the data whose errors have been corrected by the error correcting device,
   wherein said error sensing device performs error detection using a specific number of syndromes instead of using all of the syndromes for the one error correction code.

2. The data transmission system according to claim 1, wherein said error sensing device comprises an IED parity computing device configured to calculate a predetermined number of syndromes.

3. The data system according to claim 1, said syndrome computing device comprises a register to output said syndromes and an adder to add an input data and a feedback data from said register.

4. The data transmission system according to claim 3, wherein said syndrome computing device further comprises a multiplier to multiply said feedback data with a constant value.

5. A data transmission system comprising:
   a receiving device for receiving data to which a pair of error correction codes is added, one error correction code having a data arrangement identical with the order in which the receiving device receives the data;
   a temporary storage device for storing said data temporarily;
   an error sensing device for sensing errors in one error correction code, before storing said data in the temporary storage device, said error sensing device including a syndrome computing device which calculates a syndrome for the one of said pair of error correction codes consisting of product codes;
   an error correcting device for correcting errors in said data stored in said temporary storage device, said error correcting device executing erasure correction of the other error correction code by using information on errors in the one error correction code sensed at said error sensing device; and
   a transmitting device for transmitting the data whose errors have been corrected by the error correcting device,
   wherein said data transmission system is used for a DVD reproducing device and further comprises:
      a 8–16 decoding device for subjecting the data received by said receiving device to 8-bit-to-16-bit demodulation; and
      a scramble cancel device to which the data whose errors have been corrected at said error correcting device is inputted and which outputs the scramble-canceled data to said transmitting device.

6. The data transmission system according to claim 5, wherein said error sensing device comprises an IED parity computing device configured to calculate a predetermined number of syndromes.

7. The data transmission system according to claim 5, wherein said syndrome computing device comprises a register to output said syndromes and an adder to add an input data and a feedback data from said register.

8. The data transmission system according to claim 7, wherein said syndrome computing device further comprises a multiplier to multiply said feedback data with a constant value.

9. An error correcting method comprising:
   a first step of sensing errors in one error correction code received in the order, in which data has been received of a pair of error correction codes consisting of product codes added to said data, including calculating syndromes for said one error correction code and then storing said data in a temporary storage device;
   a second step of calling back the other error correction code of the product codes added to said data from said temporary storage device and performing not only an error correcting process using only the other error correction code but also erasure correction on the basis of information on the errors in said one error correction code sensed in said first step; and a third step of correcting said data stored in said temporary storage device, wherein said second step performs error detection using a specific number of syndromes instead of using the result of calculating all of the syndromes for said one error correction code.

10. The error correcting method according to claim 9, wherein said first step comprises a substep of calculating a predetermined number of syndromes with an IED parity computing device.

11. The error correcting method according to claim 9, wherein said first step comprises a substep of outputting said syndromes and adding an input data and said syndromes.

12. The error correcting method according to claim 11, wherein said first step further comprises a substep of multiplying said syndromes with a constant value.

13. An error correcting method comprising;

a first step of sensing errors in one error correction code, received in the order in which data has been received, of a pair of error correction codes consisting of product codes added to said data, and then storing said data in a temporary storage device;

a second step of calling back the other error correction code of the product codes added to said data from said temporary storage device and performing not only an error correction process using only the other error correction code but also erasure correction on the basis of information on the errors in one error correction code sensed in said first step;

a third step of correcting said data stored in said temporary storage device;

a fourth step of calling back said one error correction code for said data from said temporary storage device;

a fifth step of performing not only an error correcting process using only said one error correction code but also erasure correction using information on errors in said other error correction code;

a sixth step of correcting said data stored in said temporary storage device;

a seventh step of calling back said other error correction code from said temporary storage device;

an eighth step of performing not only an error correcting process using only said other error correction code but also missing-error correction on the basis of information on errors in said one error correction code; and a ninth step of correcting said data in said temporary storage device.

14. The error correcting method according to claim 13, wherein said first step comprises a substep of calculating a predetermined number of syndromes with an IED parity computing device.

15. The error correcting method according to claim 13, wherein said first step comprises a substep of outputting said syndromes and adding an input data and said syndromes.

16. The error correcting method according to claim 15, wherein said first step further comprises a substep of multiplying said syndromes with a constant value.

* * * * *